United States Patent
Baumgartner et al.

(10) Patent No.: US 7,734,452 B2
(45) Date of Patent: Jun. 8, 2010

(54) METHOD AND SYSTEM FOR PERFORMING TERNARY VERIFICATION

(75) Inventors: Jason R. Baumgartner, Austin, TX (US); Hari Mony, Austin, TX (US); Viresh Paruthi, Austin, TX (US); Matyas A. Sustik, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 643 days.

(21) Appl. No.: 11/675,698

(22) Filed: Feb. 16, 2007

(65) Prior Publication Data

US 2008/0201128 A1    Aug. 21, 2008

(51) Int. Cl.
*G06F 17/50*    (2006.01)

(52) U.S. Cl. .................. 703/2; 703/14; 716/4; 716/5; 714/741

(58) Field of Classification Search .................. 703/2, 703/14; 716/4–5; 714/741–750
See application file for complete search history.

(56) References Cited

U.S. PATENT DOCUMENTS

| 5,377,201 | A | * | 12/1994 | Chakradhar et al. | .......... 714/741 |
| 5,649,165 | A | * | 7/1997 | Jain et al. | .......... 716/5 |
| 5,657,240 | A | * | 8/1997 | Chakradhar et al. | .......... 716/4 |

* cited by examiner

*Primary Examiner*—Thai Phan
(74) *Attorney, Agent, or Firm*—Dillon & Yudell LLP

(57) ABSTRACT

A method and system for performing ternary verification is disclosed. Initially, a ternary model is generated from a binary model of a logic circuit design. The pairings used to encode the ternary model are then recorded. Next, the number of the recorded gate pairings is reduced by removing all invalid gate pairings. A ternary verification is performed on the ternary model having a reduced number of gate pairings.

12 Claims, 3 Drawing Sheets

METHOD AND SYSTEM FOR PERFORMING TERNARY VERIFICATION

BACKGROUND OF THE INVENTION

1. Technical Field

The present invention relates to integrated circuit verification tools in general, and more particularly, to a method and system for performing equivalence checking on logic circuits. Still more particularly, the present invention relates to a method and system for performing ternary verification.

2. Description of Related Art

Binary modeling is a common framework for evaluating logic designs. With binary modeling, logic gates in the form a hardware design representation are evaluated with 0,1 valuations. For example, when evaluating an AND gate, if any of its input signals is a logical 0, then the AND gate should evaluate to a logical 0; otherwise, the AND gate should evaluate to a logical 1. Given a set of 0,1 valuations to the primary inputs of a netlist, a simple deterministic binary simulation algorithm can be used to evaluate the 0,1 valuations to all gates within the netlist.

Ternary modeling evaluates logic designs with 0,1,X valuations, where X represents an "unknown" condition. Given a set of 0,1,X valuations to the primary inputs of a netlist, a simple deterministic algorithm can be used to evaluate the logic gates within the netlist with ternary modeling. For example, when evaluating an AND gate, if any of its input signals is a logical 0, then the AND gate should evaluate to a logical 0; however, if none of its input signals is a logical 0 while one of its input signals is X, then the AND gate should evaluate to X.

Ternary modeling has several practical benefits. First, if used effectively, ternary modeling can effectively double the coverage of binary evaluation for every X that is injected in place of a logical 0 or 1 input value. For example, if simulating a data-independent property of a logic circuit design, a circuit designer may simulate 0,1 values to the control inputs, and X values to all data inputs of a logic circuit design. If a run has N input valuations that take the X value, and if a property under consideration can be consistently evaluated in that ternary simulation (such as the run does not become inconclusive by propagating X values to the signals being checked with the property), such run correlates to $2^N$ binary simulations.

Second, a circuit designer may automatically infer properties with ternary modeling. For example, a circuit designer may verify that a particular Xed input valuation does not propagate or persist in a netlist by checking the downstream logic does not evaluate to X. In contrast, when using binary evaluation, such a property will not be as simply expressed.

Third, in equivalence checking applications, a circuit designer may validate that one model refines the other by checking not just that a set of signals of one logic design always evaluate to the same values in the other, but by relaxing the equality check so that equality of signals (as well as conditions where one model exhibits an X but the other exhibits a 0,1 value) are accepted.

Despite all its advantages, ternary modeling has a significant drawback. In order to accommodate a three-valued interpretation of an inherent binary netlist, each gate in the binary netlist must be modeled with two gates. This results in inefficiencies during ternary evaluation. Consequently, it would be desirable to provide an improved method and system for performing ternary verification.

SUMMARY OF THE INVENTION

In accordance with a preferred embodiment of the present invention, a ternary model is initially generated from a binary model of a logic circuit design. The pairings used to encode the ternary model are then recorded. The number of the recorded gate pairings is subsequently reduced by removing all invalid gate pairings. A ternary verification is performed on the ternary model having a reduced number of gate pairings.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
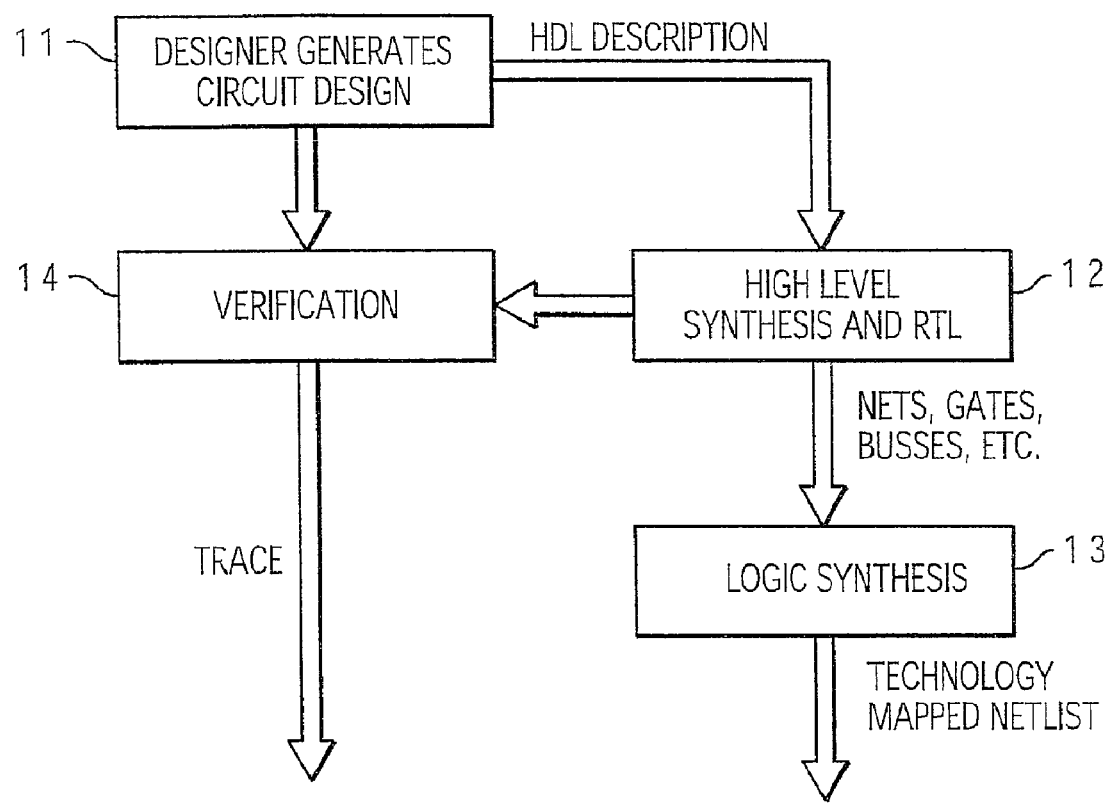
FIG. 1 is a high-level logic flow diagram of a process for generating and verifying a hardware circuit design, in accordance with a preferred embodiment of the present invention.

Referring now to the drawings, and specifically to FIG. 1, there is depicted a high-level logic flow diagram of a process for generating and verifying a hardware circuit design, in accordance with a preferred embodiment of the present invention. As shown, the process starts with a hardware description of a logic circuit design generated by a circuit designer, as shown in block 11. Such hardware description may be written in a hardware description language (HDL). High-level synthesis and register-transfer-level (RTL) synthesis are then performed on the hardware description to generate a description of a network of gates, buses, adders, registers, etc. corresponding to the hardware description in a particular format, as depicted in block 12. Logic synthesis optimizes the network description and produces a technology mapped netlist of the logic circuit design that can be used for circuit fabrication, as shown in block 13.

Verification is the process of verifying the operation of the logic circuit model. Verification may be performed on either the network description or the hardware description of the logic circuit design, as depicted in block 14. Verification may produce a trace illustrating the operation of the logic circuit design. The trace may be manually or automatically parsed in order to assess whether the logic circuit behaved properly or improperly along that trace.

With ternary modeling, each gate and signal of a binary netlist is represented by two gates in order to encode the three possible values (0, 1 and X). Generally speaking, there are three different types of ternary models, namely, ternary model 1, ternary model 2 and ternary model 3.

Ternary model 1 is depicted in Table I. As shown, an original signal s1 is modeled by signals s1a and s1b. Signal (s1a,s1b)=01 represents a ternary X value, and signal (s1a, s1b)=10 is disallowed in this modeling. Ternary model 1 effectively uses a min,max scheme in which s1a=1 implies that s1 is 1, else s1b=0 implies that s1=0. While a binary value "10" may be mapped to X, this modeling is practically a very bad choice since it does allow the determination of non-X s1 valuations by checking only one of s1a and s1b signals.

TABLE I

| s1a | s1b | s1 |
| --- | --- | --- |
| 0 | 0 | 0 |
| 0 | 1 | X |
| 1 | 0 | X or invalid |
| 1 | 1 | 1 |

Ternary model 2 is depicted in Table II. Basically, ternary model 2 uses s1b as an "X" indicator. Thus, if s1b=1, then ternary model 2 can determine that s1 is X. However, the disadvantage of ternary model 2 is that the determination of s1 to be 0 or 1 requires an analysis of both s1a and s1b.

TABLE II

| s1a | s1b | s1 |
| --- | --- | --- |
| 0 | 0 | 0 |
| 0 | 1 | X |
| 1 | 0 | 1 |
| 1 | 1 | X or invalid |

Ternary model 3 is depicted in Table III. Ternary model 3 tends to be the most commonly used model for ternary analysis. With ternary model 3, s1a indicates that s1 can be 0, and s1b indicates that s1 can be 1. Again, the disadvantage of ternary model 3 is that the determination of s1 to be 0 or 1 requires an analysis of both s1a and s1b.

TABLE III

| s1a | s1b | s1 |
| --- | --- | --- |
| 0 | 0 | X or invalid |
| 0 | 1 | 1 |
| 1 | 0 | 0 |
| 1 | 1 | X or invalid |

Depending on the chosen ternary modeling (i.e., ternary model 1 through ternary model 3), algorithms for generating a ternary model from a binary one will duplicate signals and gates in a manner that preserves the chosen ternary modeling in a straight-forward manner. For example, using ternary model 1, consider a 2-input AND gate g1 over gates g2 and g3. Gate g1 will be synthesized using gates g1a and g1b, where g1a will be an AND of g2a and g3a. Recall that in ternary model 1, gate g1a will be a logical 1 if and only if both gates g2 and g3 are a logical 1, which can be determined by gates g2a and g3a being a logical 1. Gate g1b will be the OR of the inverse of gate g2b and gate g3b, since gate g1b needs to be a logical 1 unless either gate g2 or gate g3 being a logical 0, which can be determined by gate g2b or gate g3b being a logical 0.

The method of the present invention has three separate stages. The first stage generates a ternary model from a binary model, which enables efficient reductions both for verification of one ternary model alone as well as for verification in equivalence-checking type of settings that operate on two ternary models. The first stage converts every gate/signal in the binary model to two gates/signals in the ternary model, and implements a per-gate conversion of a ternary encoding scheme such as those presented in Table I through Table III. The encoding scheme presented in Table I is preferably utilized for the present invention due to the above-mentioned benefits to the verification process.

The second stage extracts information during the ternary model generation that will be utilized to simplify subsequent verification tasks. Such information include a list of gate pairings from the ternary model, where each gate pairing reflects the two gates used to ternary-encode a particular gate in the original ternary model. As will be discussed in the third stage, such information should be taken into account by an efficient verification framework. In particular, the verification framework may be able to utilize the fact that many gates in the original ternary model cannot be evaluated to the value X; hence, there is redundancy among the two gates used to ternary-encode those gates. The verification framework may desire to leverage such redundancy to eliminate some redundant gates, for example. Such a highly efficient verification framework provides the third stage. While there are many conventional techniques for identifying and eliminating redundant gates, those conventional techniques tend to require exorbitant resources, particularly if applied to a very large ternary model. In contrast, by leveraging the knowledge of the ternary-modeled gate pairings, such redundant gate elimination algorithms may be made dramatically more powerful and scalable because resources are focused merely on attempting to identify which ternary-expanded gates can never take the value X.

The third stage reduces the size of ternary models, which exploits the modeling and information generated in the prior two stages. The reduction phase of the third stage is also efficient in solving interesting properties in ternary modeling.

In accordance with a preferred embodiment of the present invention, the gate pairing information is utilized to break groups into gate pairs at the largest. This step can be implemented as a pre-process, and additional techniques can be employed to break gate pairings even further if the gate pairings are not redundant, reflecting the case in which the corresponding signal can evaluate to the value X.

Figure 2:
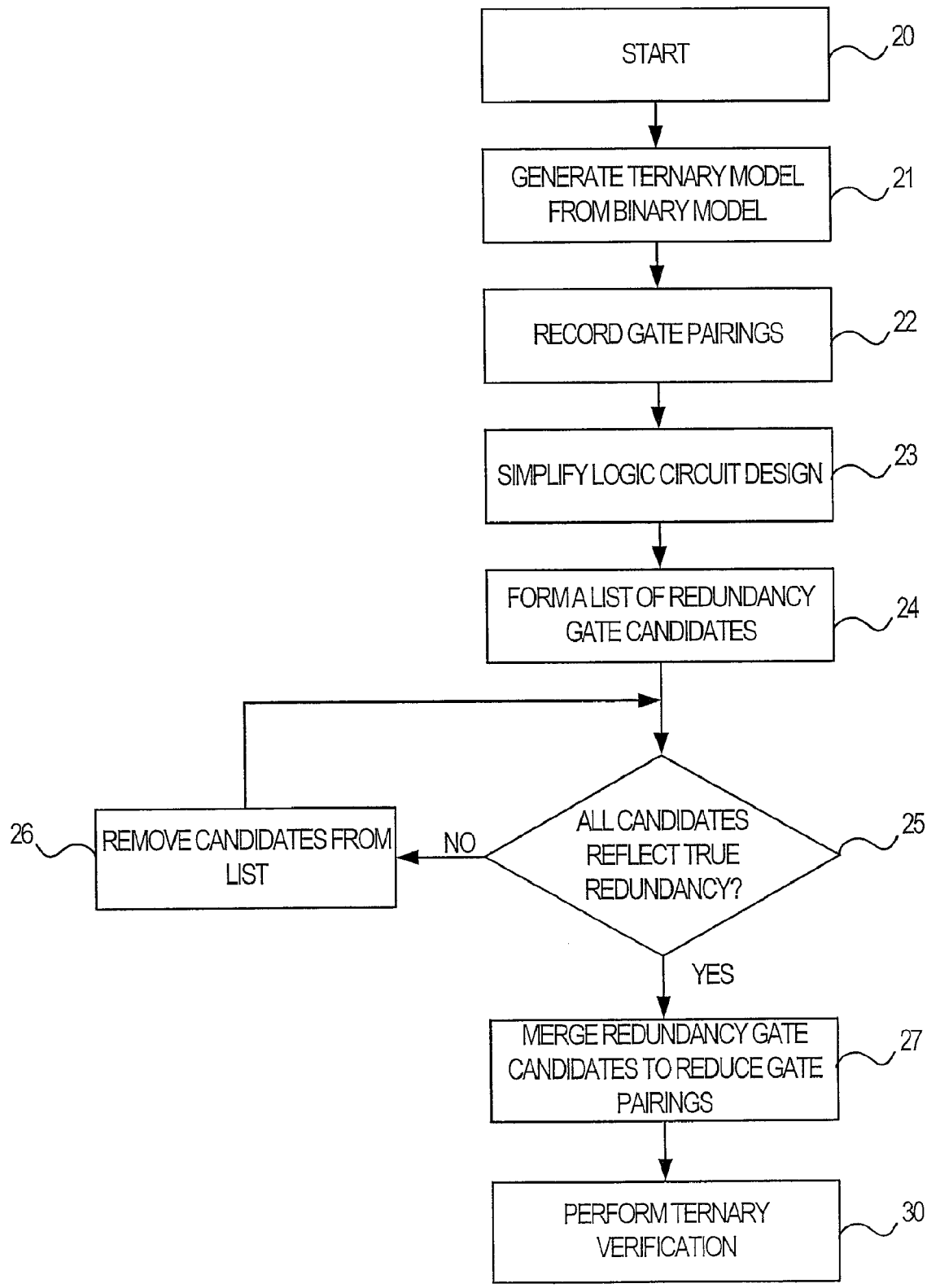
FIG. 2 is a high-level logic flow diagram of a method for performing ternary verification, in accordance with a preferred embodiment of the present invention.

With reference now to FIG. 2, there is depicted a high-level logic flow diagram of a method for performing ternary verification, in accordance with a preferred embodiment of the present invention. Starting at block 20, a ternary model is generated from a binary model of a logic circuit design, as shown in block 21. The gate pairings information used in the ternary model generation are then recorded, as depicted in block 22. Optionally, the logic circuit design can be optimized by using a set of transformation algorithms, as shown in block 23. A variety of known techniques may be utilized to perform such optimization. For example, retiming is a technique that attempts to reduce the number of state-holding gates of a logic circuit design by relocating the state-holding gates across combinational gates. Also, logic rewriting algorithms may be utilized to minimize the number of gates of a logic circuit design by re-implementing the gate more efficiently. In addition, over-approximation and re-encoding techniques can be utilized to eliminate portions of a logic circuit design irrelevant to the properties being verified of them. When using transformation algorithms, such as redundancy removal or re-timing, the information obtained from the optimization process are made available to those algorithms in order to avoid sub-optialities.

Within the gate pairings previously recorded (from block 22), an initial list of redundancy gate candidates is made by identifying all invalid gate pairings (i.e., the X value can appear at a corresponding gate), as depicted in block 24. This process consists of the following steps. First, the list of gate pairings used in the ternary encoding from block 22 is obtained as the base redundancy gate candidate list. Next, an attempt is made to eliminate those gate pairings that are not of use in the simplification of the ternary model because an X value may appear at the corresponding gate. Such elimination may be performed using a variety of techniques, such as performing logic simulation to the ternary model, i.e., to explore the behavior of the logic circuit design against arbitrarily-selected input stimulus, and eliminate any gates upon which an X value may appear from the redundancy gate candidate list. Alternatively, some form of formal or semi-formal analysis may be used to attempt to symbolically identify any gates that may take an X value, and then eliminate that gate from the redundancy gate candidate list.

A determination is then made whether or not all the redundancy gate candidates can be proven to reflect true redundancy, as shown in block 25. If all the redundancy gate candidates cannot be proven to reflect true redundancy, then the unproven redundancy gate candidates are removed from the list, as depicted in block 26, and the process returns to block 25. Otherwise, if all the redundancy gate candidates can be proven to reflect true redundancy, then the redundancy gate candidates are merged to reduce the size of the ternary model, as shown in block 27. Finally, a ternary verification is performed on the reduced size ternary model, as depicted in block 30.

As has been described, the present invention provides an improved method and system for performing ternary verification. The method of the present invention operates several orders of magnitude faster than the general-purpose sequential redundancy removal approach. The method of the present invention focuses directly on ternary-style redundancy, and since each group has at most two gates, it dramatically reduces the number of iterations.

Another interesting aspect of the method of the present invention is that, for many verification problems, particularly those that try to check that X values do not propagate where they are not expected, the method of the present invention reduces ternary verification to redundancy removal. If the ternary gate pair, where X is not expected being merged through the modified reduction removal algorithm, the verification problem has been efficiently solved.

The method of the present invention may be implemented by a computer system executing a sequence of program instructions for carrying out the steps of the method and may be embodied in a computer usage media capable of storing program instructions. The present invention applies equally regardless of the particular type of signal bearing media utilized to actually carry out the distribution. Examples of signal bearing media include, without limitation, recordable type media such as floppy disks or compact discs and transmission type media such as analog or digital communications links.

Figure 3:
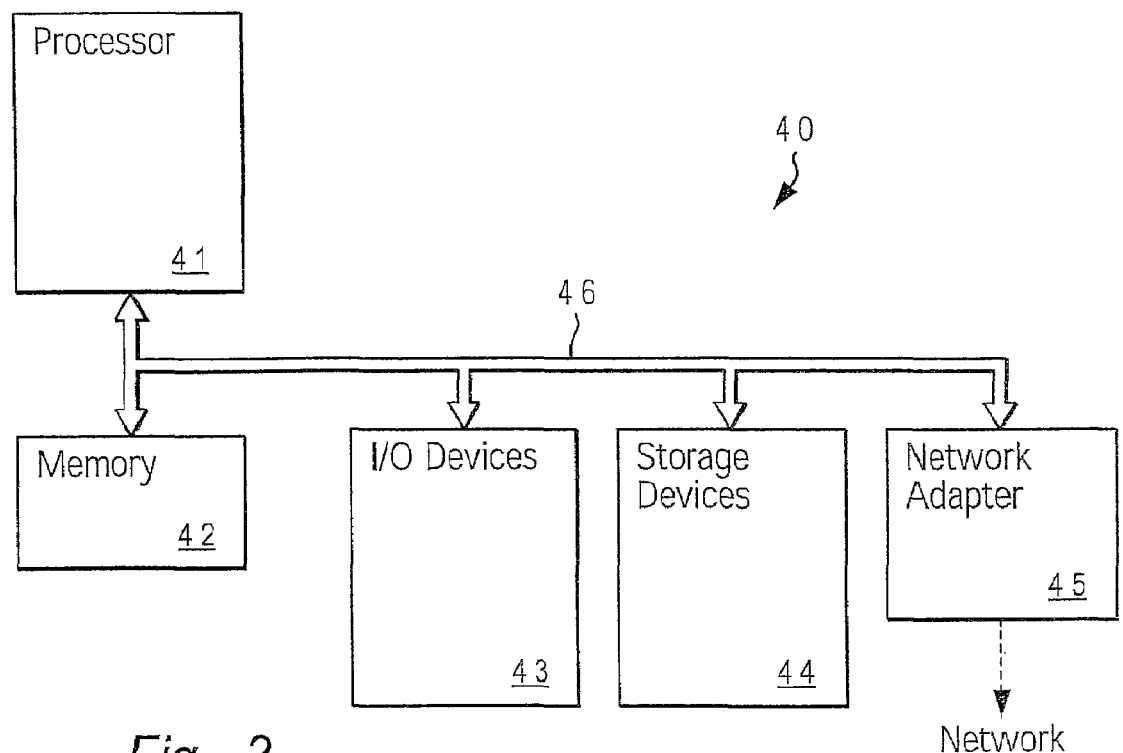
FIG. 3 is a block diagram of a computer in which a preferred embodiment of the present invention can be incorporated.

Referring now to FIG. 3, there is depicted a block diagram of a computer system in which a preferred embodiment of the present invention can be incorporated. As shown, a computer system 40 includes a processor 41 coupled to a memory 42 via a bus 46. Processor 41 executes sequences of program instructions resided in memory 42. The program instructions resided in memory 42 are preferably loaded from storage devices 44, such as hard disks, that are also coupled to bus 46. The program instructions may also be loaded from a network via network adapter 45. Also coupled to bus 46 are I/O devices 43, such as video displays, printers, keyboards, mice and scanners, for providing user inputs and outputs.

While the invention has been particularly shown and described with reference to a preferred embodiment, it will be understood by those skilled in the art that various changes in form and detail may be made therein without departing from the spirit and scope of the invention.

What is claimed is:

1. A computer implemented method for performing ternary verification, said method comprising:
   generating a ternary model from a binary model of an integrated logic circuit design, wherein said ternary model includes a logic 0 valuation, a logic 1 valuation, and an X valuation for representing an unknown condition;
   recording gate pairings used to encode said ternary model;
   reducing the number of said recorded gate pairings by removing invalid gate pairings;
   performing ternary verification on said ternary model having a reduced number of gate pairings; and
   generating by a computer a result of said ternary verification.

2. The method of claim 1, wherein said invalid gate pairings are gates at which an X value can appear.

3. The method of claim 1, wherein said method further includes optionally simplifying said logic circuit design by using a set of transformation algorithms.

4. The method of claim 1, wherein said reducing further includes
   making a list of redundancy gate candidates by identifying all invalid gate pairings within said recorded gate pairings;
   determining whether or not any of said redundancy gate candidates can be proven to reflect true redundancy;
   in a determination that a redundancy gate candidate cannot be proven to reflect true redundancy, removing said redundancy gate candidate from said list; and
   in a determination that all of said redundancy gate candidates can be proven to reflect true redundancy, merging said redundancy gate candidates to reduce gate pairings.

5. A computer usable medium having a computer program product for performing ternary verification, said computer usable medium comprising:
   computer program code for generating a ternary model from a binary model of a logic circuit design, wherein said ternary model includes a logic 0 valuation, a logic 1 valuation, and an X valuation for representing an unknown condition;
   computer program code for recording gate pairings used to encode said ternary model;
   computer program code for reducing the number of said recorded gate pairings by removing invalid gate pairings;
   computer program code for performing ternary verification on said ternary model having a reduced number of gate pairings; and
   computer program code for generating a result of said ternary verification.

6. The computer usable medium of claim 5, wherein said invalid gate pairings are gates at which an X value can appear.

7. The computer usable medium of claim 5, wherein said computer usable medium further includes computer program code for optionally simplifying said logic circuit design by using a set of transformation algorithms.

8. The computer usable medium of claim 5, wherein said computer program code for reducing further includes
   computer program code for making a list of redundancy gate candidates by identifying all invalid gate pairings within said recorded gate pairings;

computer program code for determining whether or not any of said redundancy gate candidates can be proven to reflect true redundancy;

computer program code for, in a determination that a redundancy gate candidate cannot be proven to reflect true redundancy, removing said redundancy gate candidate from said list; and computer program code for, in a determination that all of said redundancy gate candidates can be proven to reflect true redundancy, merging said redundancy gate candidates to reduce gate pairings.

9. A computer system for performing ternary verification, said computer system comprising:

means for generating a ternary model from a binary model of a logic circuit design, wherein said ternary model includes a logic 0 valuation, a logic 1 valuation, and an X valuation for representing an unknown condition;

means for recording gate pairings used to encode said ternary model;

means for reducing the number of said recorded gate pairings by removing invalid gate pairings; and means for performing ternary verification on said ternary model having a reduced number of gate pairings.

10. The computer system of claim 9, wherein said invalid gate pairings are gates at which an X value can appear.

11. The computer system of claim 9, wherein said computer system further includes means for optionally simplifying said logic circuit design by using a set of transformation algorithms.

12. The computer system of claim 9, wherein said means for reducing further includes means for making a list of redundancy gate candidates by identifying all invalid gate pairings within said recorded gate pairings;

means for determining whether or not any of said redundancy gate candidates can be proven to reflect true redundancy;

means for, in a determination that a redundancy gate candidate cannot be proven to reflect true redundancy, removing said redundancy gate candidate from said list; and means for, in a determination that all of said redundancy gate candidates can be proven to reflect true redundancy, merging said redundancy gate candidates to reduce gate pairings; and means for generating a result of said ternary verification.

* * * * *